United States Patent
Durec et al.

[19]

[11] Patent Number: 5,886,547
[45] Date of Patent: Mar. 23, 1999

[54] CIRCUIT AND METHOD OF CONTROLLING MIXER LINEARITY

[75] Inventors: Jeffrey C. Durec, Chandler; William E. Main, Mesa, both of Ariz.

[73] Assignee: Motorola, Inc., Schaumburg, Ill.

[21] Appl. No.: 771,348

[22] Filed: Dec. 16, 1996

[51] Int. Cl.[6] .................................................. H04B 1/28
[52] U.S. Cl. ...................... 327/113; 327/359; 455/296; 455/333
[58] Field of Search .................................. 327/113, 114, 327/116, 119, 355, 356, 358, 359; 455/296, 323, 333

[56] References Cited

U.S. PATENT DOCUMENTS

| | | | |
|---|---|---|---|
| 5,001,776 | 3/1991 | Clark | 455/226.2 |
| 5,151,625 | 9/1992 | Zarabadi et al. | 327/356 |
| 5,379,457 | 1/1995 | Nguyen | 455/323 |
| 5,497,123 | 3/1996 | Main et al. | 330/257 |
| 5,532,637 | 7/1996 | Khoury et al. | 327/359 |
| 5,548,840 | 8/1996 | Heck | 455/333 |
| 5,564,094 | 10/1996 | Anderson et al. | 455/295 |
| 5,589,791 | 12/1996 | Gilbert | 327/359 |
| 5,590,411 | 12/1996 | Sroka et al. | 455/296 |
| 5,722,062 | 2/1998 | Nakanishi et al. | 455/247.1 |

*Primary Examiner*—Kenneth B. Wells
*Assistant Examiner*—Terry L. Englund
*Attorney, Agent, or Firm*—Robert D. Atkins

[57] ABSTRACT

An integrated receiver circuit (10) has a first amplifier (12) coupled for receiving a radio frequency (RFIN) input signal. A mixer (16) has an RF input coupled to an output of the first amplifier, a local oscillator (LO) input coupled for receiving an LO signal, and an output for providing an intermediate frequency (IF) signal. A second amplifier (20) has an input coupled for receiving the IF signal, and an output for providing a receive signal strength indicator (RSSI) signal representative of an input power level of the receiver signal path. A feedback circuit (22–26 or 72, 78) is coupled between the first output of the second amplifier and a linearity control input of the mixer for controlling linearity of the mixer.

18 Claims, 1 Drawing Sheet

CIRCUIT AND METHOD OF CONTROLLING MIXER LINEARITY

BACKGROUND OF THE INVENTION

The present invention relates in general to integrated circuits and, more particularly, to a circuit and method of controlling mixer linearity in a receive signal path.

Receiver circuits are used in a myriad of wireless communication applications such as cordless telephones, pagers, and cellular telephones. A receiver circuit typically receives a radio frequency (RF) modulated signal from an antenna. The airways are continuously flooded with many distinct RF signals operating at different frequencies. The user, for example operating a cordless telephone, is only interested in a particular frequency, namely the channel frequency transmitted from the matching base unit. The receiver should as much as possible differentiate the desired RF signal and eliminate unwanted interfering RF signals, for example from a neighbor's cordless telephone, operating in an adjacent frequency channel.

The RF signals can range from power levels as low as −120 dBm to higher power levels around −10 dBm. A problem arises when the desired RF signal operates at a low power level in one frequency channel and the interfering RF signal in at least two adjacent channels operate at a higher power level. The receiver includes a mixer that downconverts the RF signal to an intermediate frequency (IF). During the mixing process, a number of inter-modulation products are generated involving the adjacent channel RF signals. In particular, the third order inter-modulation component of the adjacent channel RF signals can be translated to a frequency at or near the desired IF frequency and thereby interfere with the desired IF signal. If the adjacent channel RF signals inter-modulate directly onto or near the desired IF signal frequency, then the adjacent channels become indistinguishable from the desired channel. The distortion product can overwhelm the desired IF signal if the inter-modulation power is greater than the desired IF signal power. The interfering RF signal can overpower and prevent the receiver from discerning the desired RF signal.

In the prior art, the receiver includes an input low-noise amplifier (LNA) followed by a filter and the mixer for downconverting the RF signal to an IF signal according to a local oscillator (LO) signal. The receiver uses an automatic gain control (AGC) loop that senses the power levels of the incoming RF signals and adjusts the gain of the input LNA accordingly to control the dynamic range of the signal processed through the receiver. The AGC controls inter-modulation interference by reducing the gain in the receive signal path, typically by controlling the LNA, and thereby reducing the signal level of the adjacent channels going into the mixer.

One problem with the AGC approach is that reducing the gain of the input LNA adversely impacts the noise contribution of subsequent receiver stages and degrades the overall receiver noise figure, i.e. ratio of output SNR to input SNR. If the gain of the input LNA is high, then noise contribution from the other receiver components, e.g. filter and mixer, is non-dominant. That is, with high input LNA gain, the RF input signal is a sufficiently high level that any noise from the filter and mixer does not adversely affect the receiver sensitivity, i.e. minimum level RF signal above the noise floor that can be detected. However, when the gain of the input LNA is low, then the noise contributions from the filter and mixer becomes appreciable. The lower gain of the input LNA is especially problematic when the adjacent channel signal power is greater than the desired channel signal power. The desired channel becomes distorted with noise and the sensitivity of the receiver decreases. It is desirable to maintain the receiver sensitivity and the noise figure constant over a wide range of input signal levels.

Hence, a need exists to control the dynamic range of the receiver independent of the system noise figure and without degrading the receiver sensitivity.

DETAILED DESCRIPTION OF THE PREFERRED EMBODIMENT

Figure 1:
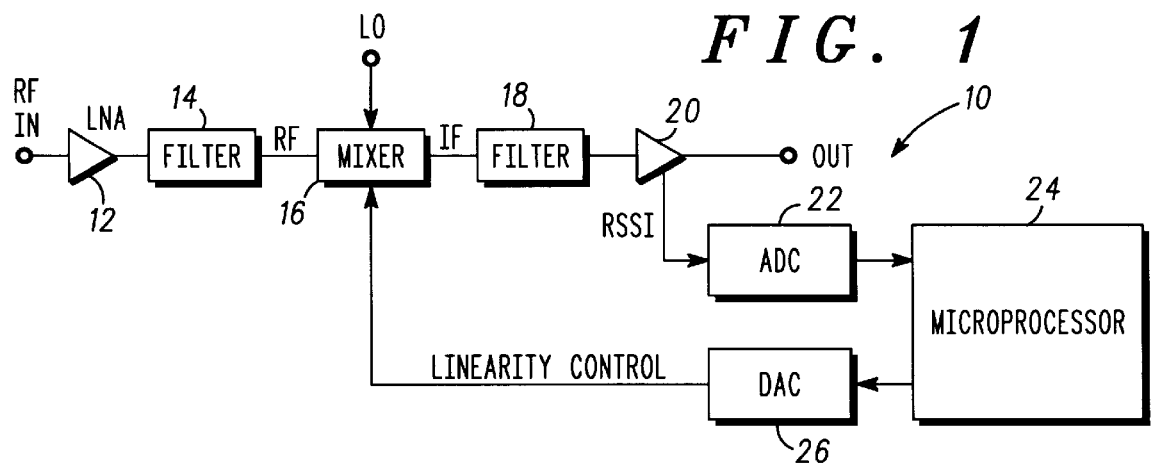
FIG. 1 is a block diagram illustrating a receiver with a linearity controlled mixer.

Referring to FIG. 1, a receiver circuit 10 is shown suitable for use in a wireless communication device such as a pager, cellular telephone, or cordless telephone. Receiver 10 includes a receive signal path including amplifier 12, filter 14, mixer 16, filter 18, and limiting amplifier 20. Receiver 10 receives a modulated RF input signal RFIN operating at say 900 MHz. Voice signals or other data is modulated onto the RFIN signal. Amplifier 12 is a low-noise amplifier (LNA) that provides 15 dB of gain for the RFIN signal. Filter 14 filters the amplified signal. Filter 14 is a ceramic two-pole Chebyshev bandpass filter centered at 900 MHz with a pass bandwidth of 3 MHz. Alternately, filter 14 can be implemented as a surface acoustic wave (SAW) filter, an inductor-capacitor (LC) filter, or a resistor-capacitor (RC) filter. The output of filter 14 is coupled to the RF input of mixer 16. Mixer 16 has an LO input that receives an LO signal operating at 910 MHz for downconverting the RF signal to a 10 MHz IF output signal. Mixer 16 provides the IF signal to filter 18. Filter 18 is a ceramic two-pole Chebyshev bandpass filter centered at 10 MHz with a pass bandwidth of 300 KHz. Amplifier 20 is a limiting amplifier that receives the filtered IF signal and provides 100 dB of gain. A first output of amplifier 20 provides an output signal OUT to other components in receiver 10 such as a demodulator (not shown).

The principal function of receiver 10 is to process the RFIN input signal operating at a particular frequency. The desired information, e.g. telephone voice signal or pager data, is modulated at that RF frequency. The desired RF signal has a certain power level depending on many factors such as the output power of the transmitting device, the distance between the transmitter and receiver, and environmental conditions. In most situations, there are other RF signals operating in nearby frequencies or adjacent channels. The other adjacent channels' RF signals can have power levels that are higher than the desired RF signal. Filter 14 has limited effectiveness in rejecting the adjacent channel RF signals depending in part on their frequency and power level.

As described in the background, during the mixing process where the desired RF signal is downconverted to an IF signal, a number of inter-modulation products are generated involving the adjacent channel RF signals. In particular, the third order inter-modulation component of at least two adjacent channel RF signals can be translated to a frequency at or near the desired IF frequency and thereby interfere with the desired IF signal. If the adjacent channel RF signals inter-modulate directly onto or near the desired IF signal frequency, then the adjacent channels become indistinguishable from the desired channel. The distortion product can overwhelm the desired IF signal if the inter-modulation power is greater than the desired IF signal power. The desired voice signal becomes distorted or lost.

The inter-modulation products arise because of non-linearities in mixer 16. If the inter-modulation power is reduced, then the desired RF signal is subject to less distortion. One way of reducing the power in the inter-modulation products is to linearize the operation of mixer 16. To provide linearity control for mixer 16, the power level in the receive signal path is monitored and a linearity control feedback signal is generated according to that power level. A higher power level in the receive signal path corresponds to a greater linearity control signal which in turn makes the operation of mixer 16 more linear, and reduces the inter-modulation power and distortion of the desired RF signal.

To monitor the receive signal path power level, amplifier 20 uses a logarithmic amplifier with an output RC filter to provide a received signal strength indicator (RSSI) signal having an amplitude representative of the power in the receive signal path. In the present embodiment, the receive signal path power is monitored at the input to amplifier 20, e.g. RSSI=K log ($P_{IN}$) where K is a constant and $P_{IN}$ is the input power of amplifier 20. For example, amplifier 20 can detect power ranges from −100 dBm to −20 dBm. The RSSI signal correspondingly ranges from 0 volts for $P_{IN}$=−100 dBm to 4 volts for $P_{IN}$=−20 dBm, or in other words 1 volt/20 dBm. A second output of amplifier 20 provides the RSSI signal to a 4-bit analog-digital converter (ADC) 22.

In the present invention, the power level in the receive signal path can be monitored at other or additional points as well. For example, a second limiting amplifier (not shown) following the first limiting amplifier could provide a second RSSI signal. The first limiting amplifier 20 monitors lower power levels and the second limiting amplifier monitors higher power levels. The first and second RSSI signals are summed together to provide a composite RSSI signal to ADC 22.

Microprocessor 24 operates as a logic control block to make a decision based on the digital value from ADC 22 of the power level in the receive signal path. Microprocessor 24 performs a comparison of the digital value of RSSI against a threshold to determine a linearity control factor. Assume the threshold is set to a level corresponding to a −60 dBm power level in the receive signal path (RSSI=2 volts). If the RSSI signal is less than 2 volts then microprocessor 24 generates a linearity control factor of zero. If the RSSI signal is greater than 2 volts then microprocessor 24 generates a linearity control factor of one. Alternatively, microprocessor 24 performs a table look-up, or other transformation, to match the digital value of RSSI to a linearity control factor. For example, an RSSI signal less than 1 volt could translate to a digital linearity control factor of "00" in microprocessor 24. Similarly, a RSSI signal between 1 volt and 2 volts translates to a linearity control factor of "01", and a RSSI signal between 2 volts and 3 volts becomes a linearity control factor of "10" in microprocessor 24. A RSSI signal between 3 volts and 4 volts translates to a linearity control factor of "11". In another embodiment, the logic control block could be implemented with dedicated logic gates to make the translation from the digital value of the RSSI signal to the linearity control factor.

The digital linearity control factor from microprocessor 24 is converted to a LINEARITY CONTROL feedback signal by digital-analog converter (DAC) 26. In the present embodiment, the LINEARITY CONTROL signal is a feedback current that is applied to a linearity control input of mixer 16 to control its linearity. The LINEARITY CONTROL signal could also be a feedback voltage. If the receive signal path power level power is low, the LINEARITY CONTROL signal is small or zero. In the above example, if RSSI is less than 1 volt, then the linearity control factor is "00" and LINEARITY CONTROL becomes a zero current. In this case, the power in the receive signal path is low indicating little or no inter-modulation distortion. Mixer 16 is allowed to operate in a non-linear manner to save overall power consumption in receiver 10.

As the receive signal path power level increases, the LINEARITY CONTROL signal steps up to cause mixer 16 to operate in a more linear manner as discussed below. If RSSI is between 1 volt and 2 volts, then the linearity control factor is "01" and LINEARITY CONTROL is set to a 0.1 milliamp (mA) current. If RSSI is between 2 volts and 3 volts, then the linearity control factor is "10" and LINEARITY CONTROL is a 0.2 mA current. If RSSI is between 3 volts and 4 volts, then the linearity control factor is "11" and LINEARITY CONTROL becomes a 0.3 mA current.

Figure 2:
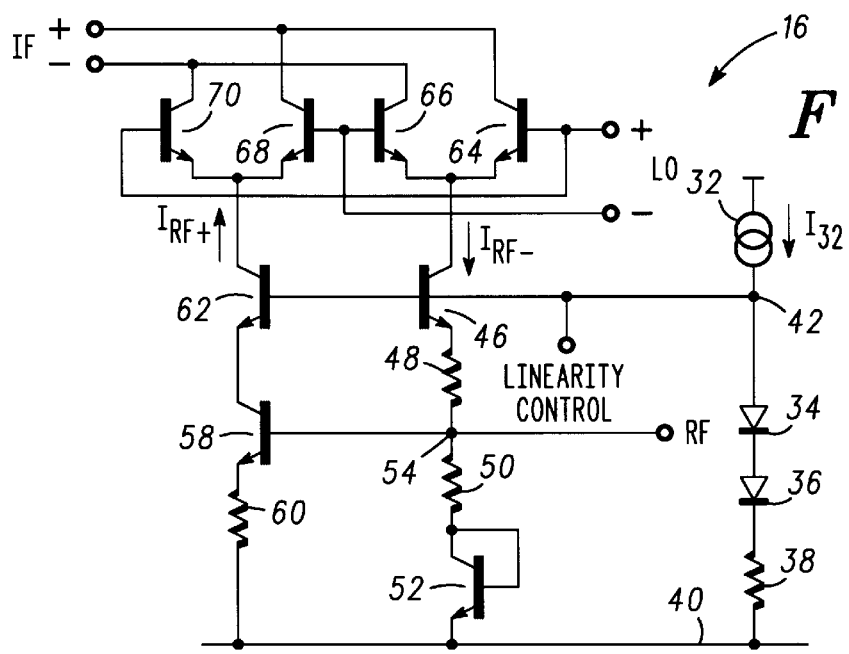
FIG. 2 is a schematic diagram illustrating further detail of the mixer of FIG. 1.

Turning to FIG. 2, mixer 16 is shown including current source 32 providing a 0.2 mA reference current $I_{32}$ to a voltage reference circuit comprising diodes 34 and 36 and resistor 38. The reference current $I_{32}$ is returned to power supply conductor 40 operating at ground potential. Resistor 38 is selected at 1000 ohms. Given the voltage across each diode in FIG. 2 as approximately 800 millivolts (mV), there is a 1.8 volt reference voltage is established at node 42.

Transistor 46, resistors 48 and 50, and transistor 52 form a first conduction path in mixer 16. The first conduction path conducts current $I_{RF}$− in response to the RF input signal applied at node 54. First consider a neutral operating state without the RF signal and zero LINEARITY CONTROL current. From the 1.8 volt reference at node 42, there is one base-emitter junction potential ($V_{be}$) in transistor 46, the voltage drop across resistors 48 and 50, and another $V_{be}$ in transistor 52. Resistors 48 and 50 are matched at 60 ohms and each develop approximately 100 mV of potential with the current $I_{RF}$− flowing in the first conduction path. Node 54 is therefore about 900 mV.

Transistors 58 and 62 and resistor 60 form a second conduction path in mixer 16. The second conduction path conducts current $I_{RF}$+ in response to the RF input signal at node 54. Resistor 60 is selected at 60 ohms and develops a potential of 100 mV with the current $I_{RF}$+ flowing in the second conduction path. The emitter of transistor 62 is 800 mV less than node 42 or approximately 1 volt. The bases of transistors 46 and 62 are coupled together and receive the reference voltage developed at node 42 which is the common control input of mixer 16.

Now consider the operation of mixer 16 with the RF signal. When the RF signal increases, more current flows through transistor 52 as its $V_{be}$ increases. Less current flows through transistor 46 because its $V_{be}$ decreases with node 42 fixed. The RF input of mixer 16 sources the additional current for transistor 52. The increase current in transistor 52 causes more current to flow in transistor 58. The same current flows through transistors 58 and 62. Therefore, as the RF signal increases, the $I_{RF}$− current decreases and the $I_{RF}$+ current increases.

When the RF signal decreases, less current flows through transistor 52 as its $V_{be}$ decreases. More current flows through transistor 46 because its $V_{be}$ increases. The decreasing current in transistor 52 causes less current to flow in transistor 58. Therefore, as the RF signal decreases, the $I_{RF}-$ current increases and the $I_{RF}+$ current decreases.

Transistors 64 and 66 and transistors 68 and 70 operate as a switching circuit under control of differential local oscillator signal ±LO. When +LO is greater than −LO, transistors 64 and 70 conduct collector currents from transistors 46 and 62, respectively. When −LO is greater than +LO, transistors 66 and 68 conduct collector currents from transistors 46 and 62, respectively. A differential signal ±IF is provided at the common collectors of transistors 66 and 70 and at the common collectors of transistors 64 and 68. The RF signal seen differentially as current $\pm I_{RF}$ in the collectors of transistors 46 and 62 is switched between transistors 64–70 at the LO signal rate. The RF signal operating at 900 MHz is thus downconverted by the LO signal operating at 910 MHz to an IF signal operating at 10 MHz, i.e. $IF_{FREQ} = LO_{FREQ} - RF_{FREQ}$.

The transfer function of mixer 16 is given as:

$$\Delta I_{RF} / \Delta V_{RF} = 2/(1/g_m + R_E) \quad (1)$$

where:

$\Delta I_{RF}$ is difference $I_{RF}+$ and $I_{RF}-$ $\Delta V_{RF}$ is the RF signal voltage at node 54

$g_m$ is the transconductance of the transistors $R_E$ is the value of resistors 48 and 50

The transconductance $g_m$ of transistors 46, 52, 58, and 62 is determined by their emitter resistor $r_e$ as follows:

$$r_e = V_t / I_C = (kT/q)/I_C \quad (2)$$

where:

k is Boltzmann's constant

T is temperature q is an electron charge $I_C$ is the collector current

When $R_E$ is negligible compared to $1/g_m$, then $\Delta I_{RF}/\Delta V_{RF} \approx 2g_m$. The transconductance $g_m$ of a transistor is non-linear because of the well known exponential relationship between collector current and emitter-base voltage. On the other hand, resistance $R_E$ (resistors 48 and 50) is linear. When $R_E$ is much larger than $1/g_m$ ($R_E \gg 1/g_m$), then $\Delta I_{RF}/\Delta V_{RF} \approx 2/R_E$ and equation (1) becomes more linear. The linearity of mixer 16 can be controlled by adjusting the contribution of $r_e$ to equation (1) such that $R_E$ dominates the transfer function. The emitter resistance $r_e$ is made effectively smaller by increasing collector current $I_C$ as per equation (2). In other words, if collector current $I_C$ is made larger, then resistance $r_e$ becomes effectively smaller and the overall operation of mixer 16 becomes more linear. By operating more linearly, the IF output frequency of mixer 16 linearly tracks the difference between LO frequency and the RF frequency. The cost of linearizing mixer 16 is greater power consumption, but the benefit is reducing the generation of inter-modulation products from adjacent channels during the mixing process.

As a feature of the present invention, the LINEARITY CONTROL feedback current is used to control the linearity of mixer 16. When the receive signal path power level is less than the minimum threshold determined by microprocessor 24, i.e. RSSI<1 volt, the LINEARITY CONTROL feedback current is zero and mixer 16 operates its most non-linear fashion where 1/gm dominates the transfer function in equation (1). In full non-linear mode, mixer 16 downconverts the RF signal to the IF signal with transistors 46–62 operating in their most non-linear mode. The linearity control is not necessary because the power level in the receive signal path is sufficiently low that inter-modulation products from adjacent channels should not interfere with the desired RF signal. Mixer 16 consumes less power in full non-linear mode as compared with the varying levels of linearity control mode discussed below.

When the receive signal path power level is greater than the minimum threshold determined by microprocessor 24, i.e. RSSI>1 volt, the LINEARITY CONTROL signal becomes non-zero and mixer 16 begins to operate in linearity control mode. The reference voltage at node 42 increases as the LINEARITY CONTROL feedback current flows through diodes 34 and 36 and resistor 38. The principal change in the reference voltage at node 42 is due to the greater voltage drop across resistor 38. As the reference voltage at node 42 increases, the $V_{be}$ of transistors 46, 52, 58, and 62 increase and thereby conduct more collector current. For example, if the LINEARITY CONTROL feedback current is 0.1 mA, the reference voltage increases by 100 mV to 1.9 volts. The voltage drop across resistors 48 and 50 increase by 50 mV each with the additional collector current flow. The increasing collector current $I_C$ makes the emitter resistance $r_e$ effectively smaller as per equation (2). The resistor $R_E$ in the transfer function of equation (1) begins to dominate over $1/g_m$ and linearize mixer 16.

If the LINEARITY CONTROL feedback current goes to 0.2 mA with an even greater receive signal path power level, the reference voltage increases by another 100 mV to 2.0 volts. The voltage drop across resistors 48 and 50 increase by another 50 mV each with the additional collector current flow. The increasing collector current $I_C$ makes the emitter resistance $r_e$ effectively smaller as per equation (2). The resistor $R_E$ in the transfer function of equation (1) has an even greater dominance over $1/g_m$ and increases the linearity of mixer 16. If the LINEARITY CONTROL feedback current is 0.3 mA as described above, the reference voltage increases by yet another 100 mV to 2.1 volts. The voltage drop across resistors 48 and 50 increase by another 50 mV each with the additional collector current flow. The resistor $R_E$ in the transfer function of equation (1) has total dominance over $1/g_m$ and provides maximum linearity of mixer 16. The linearity control of mixer can provide 48 dB reduction in the inter-modulation power level and thereby reduce distortion in the desired RF signal.

Figure 3:
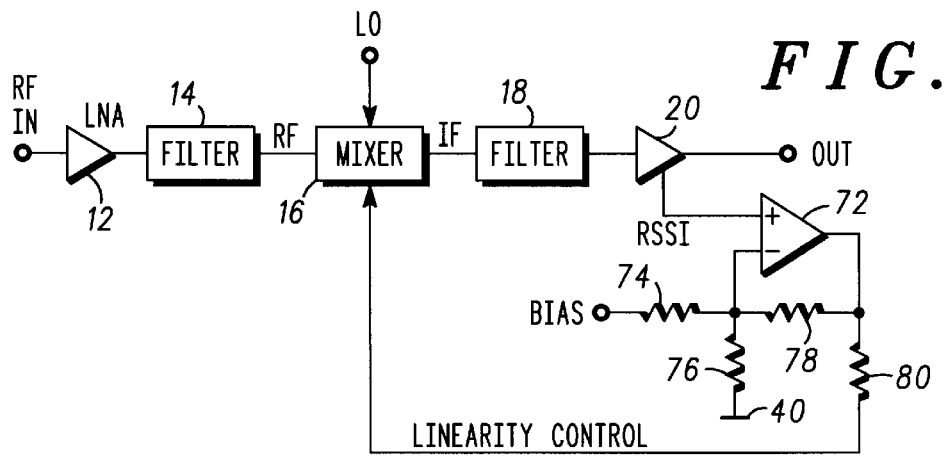
FIG. 3 is a block diagram illustrating an alternate embodiment for the receiver.

An alternate embodiment of the present invention is shown in FIG. 3. Circuit elements assigned the same reference numbers used in FIG. 1 provide a similar function. In the feedback path, the RSSI signal is applied to a non-inverting input of amplifier 72. A BIAS voltage is applied through resistor 74 to an inverting input of amplifier 72. Resistors 76 and 78 provide feedback around amplifier 72 to set its gain. Amplifier 72 provides a linear gain such that its output voltage is some constant times the input voltage. Resistor 80 converts the output voltage of amplifier 72 to a current which is applied to the linearity control input of mixer 16. Alternatively with sufficient gain, amplifier 72 could operate as a comparator and provide either no linearity control or maximum linearity control.

By now it should be appreciated, the present invention provides linearity control for a mixer. The linearity of the mixer is externally controlled in a feedback loop by monitoring the power level in the receive signal path. The feedback loop generates a linearity control signal representative of the power level in the receive signal path that increases the current flow in the mixer conduction paths and thereby increases its linearity. By controlling the linearity of the mixer, the inter-modulation power level is reduced which results in less distortion for the desired RF signal. Since controlling the linearity of the mixer does not effect its gain, a high level RF signal can be processed through the mixer without increasing the noise figure of the system. There is substantially no increase in noise contribution from the mixer because its gain is not changed. The dynamic range of the receiver becomes independent of the system noise figure without degrading the receiver sensitivity.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A mixer, comprising:
   first and second conduction paths for conducting first and second currents respectively in response to an input signal operating at a first frequency, the first and second conduction paths having a common control input coupled for receiving a linearity control signal that increases the first and second currents to increase linearity in the mixer;
   a reference voltage circuit providing a reference voltage to the common control input; and
   a switching circuit coupled for receiving the first and second currents and responsive to an oscillator signal for switching the first and second currents and providing an output signal of the mixer operating at a second frequency different than the first frequency of the input signal.

2. The mixer of claim 1 wherein the first conduction path includes:
   a first transistor having a first conduction terminal for providing the first current, and a control terminal coupled to the common control input for receiving the reference voltage; and
   a second transistor having a first conduction terminal coupled to a second conduction terminal of the first transistor at a first node where the input signal is applied, a control terminal coupled to the first conduction terminal of the second transistor, and a second conduction terminal coupled to a power supply conductor.

3. The mixer of claim 2 wherein the first conduction path further includes:
   a first resistor coupled between the second conduction terminal of the first transistor and the first node; and
   a second resistor coupled between the first node and the first conduction terminal of the second transistor.

4. The mixer of claim 2 wherein the second conduction path includes:
   a third transistor having a first conduction terminal for providing the second current, and a control terminal coupled to the common control input for receiving the reference voltage; and
   a fourth transistor having a first conduction terminal coupled to a second conduction terminal of the third transistor, a control terminal coupled to the first node, and a second conduction terminal coupled to the power supply conductor.

5. The mixer of claim 4 wherein the second conduction path further includes a resistor coupled between the second conduction terminal of the fourth transistor and the power supply conductor.

6. The mixer of claim 1 wherein the switching circuit includes:
   a first transistor having a first conduction terminal coupled for receiving the first current, a control terminal coupled for receiving a first component of the oscillator signal, and a second conduction terminal for providing a first component of the output signal of the mixer;
   a second transistor having a first conduction terminal coupled for receiving the first current, a control terminal coupled for receiving a second component of the oscillator signal, and a second conduction terminal for providing a second component of the output signal of the mixer;
   a third transistor having a first conduction terminal coupled for receiving the second current, a control terminal coupled for receiving the second component of the oscillator signal, and a second conduction terminal for providing the first component of the output signal of the mixer; and
   a fourth transistor having a first conduction terminal coupled for receiving the second current, a control terminal coupled for receiving the first component of the oscillator signal, and a second conduction terminal for providing the second component of the output signal of the mixer.

7. An integrated circuit, comprising:
   a receive signal path including a mixer having an RF input coupled for receiving a radio frequency (RF) input signal, a local oscillator (LO) input coupled for receiving an LO signal, and an output for providing an intermediate frequency (IF) signal, wherein the mixer includes,
   (a) first and second conduction paths for conducting first and second currents respectively in response to the RF input signal operating at a first frequency, wherein the first and second conduction paths have a common control input coupled for receiving a linearity control signal that increases the first and second currents to increase linearity in the mixer,
   (b) a reference voltage circuit providing a reference voltage to the common control input, and
   (c) a switching circuit coupled for receiving the first and second currents and responsive to the LO signal for switching the first and second currents and providing the IF signal of the mixer operating at a second frequency different than the first frequency of the RF input signal; and
   a feedback circuit coupled for receiving a receive signal strength indicator (RSSI) signal representative of a power level in the receive signal path and providing the linearity control signal to the common control input of the first and second conduction paths of the mixer.

8. The integrated circuit of claim 7 wherein the receive signal path further includes, comprising:
   a first amplifier having an input coupled for receiving the RF input signal, and an output coupled to the RF input of the mixer; and
   a second amplifier having an input coupled to the output of the mixer, and a first output for providing the receive signal strength indicator (RSSI) signal to an input of the feedback circuit.

9. The integrated circuit of claim 7 wherein the feedback circuit includes a comparator having a first input coupled for receiving the RSSI signal, a second input coupled for receiving a bias signal, and an output providing the linearity control signal to the common control input of the mixer.

10. The integrated circuit of claim 7 wherein the first conduction path includes:

a first transistor having a first conduction terminal for providing the first current, and a control terminal coupled to the common control input for receiving the reference voltage; and a second transistor having a first conduction terminal coupled to a second conduction terminal of the first transistor at a first node where the RF input signal is applied, a control terminal coupled to the first conduction terminal of the second transistor, and a second conduction terminal coupled to a power supply conductor.

11. The integrated circuit of claim 10 wherein the first conduction path further includes:

a first resistor coupled between the second conduction terminal of the first transistor and the first node; and a second resistor coupled between the first node and the first conduction terminal of the second transistor.

12. The integrated circuit of claim 10 wherein the second conduction path includes:

a third transistor having a first conduction terminal for providing the second current, and a control terminal coupled to the common control input for receiving the reference voltage;

a fourth transistor having a first conduction terminal coupled to a second conduction terminal of the third transistor, and a control terminal coupled to the first node; and a resistor coupled between a second conduction terminal of the fourth transistor and the power supply conductor.

13. The integrated circuit of claim 7 wherein the switching circuit includes:

a first transistor having a first conduction terminal coupled for receiving the first current, a control terminal coupled for receiving a first component of the LO signal, and a second conduction terminal for providing a first component of the IF signal of the mixer;

a second transistor having a first conduction terminal coupled for receiving the first current, a control terminal coupled for receiving a second component of the LO signal, and a second conduction terminal for providing a second component of the IF signal of the mixer;

a third transistor having a first conduction terminal coupled for receiving the second current, a control terminal coupled for receiving the second component of the LO signal, and a second conduction terminal for providing the first component of the IF signal of the mixer; and a fourth transistor having a first conduction terminal coupled for receiving the second current, a control terminal coupled for receiving the first component of the LO signal, and a second conduction terminal for providing the second component of the IF signal of the mixer.

14. The integrated circuit of claim 7 wherein the feedback circuit includes:

an analog-digital converter (ADC) having an input coupled for receiving the RSSI signal;

a logic control circuit having an input coupled to an output of the ADC for translating the RSSI signal to a linearity control factor which is provided at an output; and a digital-analog converter (DAC) having an input coupled to the output of the logic control circuit and an output providing the linearity control signal to the common control input of the mixer.

15. The integrated circuit of claim 7 wherein the feedback circuit includes an amplifier having a first input coupled for receiving the RSSI signal, a second input coupled for receiving a bias signal, and an output providing the linearity control signal to the common control input of the mixer.

16. The integrated circuit of claim 15 wherein the feedback circuit further includes a voltage-current converter coupled between the output of the amplifier and the common control input of the mixer.

17. A method of linearizing a mixer coupled in a receive signal path, comprising the steps of:

conducting first and second currents in first and second conduction paths respectively in response to an input signal operating at a first frequency;

applying a reference voltage to a common control input of the first and second conduction paths;

applying a linearity control signal representative of power in the receive signal path at the common control input of the first and second conduction paths for increasing the first and second currents to increase linearity in the mixer; and switching the first and second currents in response to an oscillator signal and providing an output signal from the mixer operating at a second frequency less the first frequency of the input signal.

18. The method of claim 17 wherein the step of applying a linearity control signal at a common control input of the first and second conduction paths includes the step of injecting the linearity control signal as a current to increase the reference voltage.

* * * * *